US006421250B1

(12) United States Patent
Kim et al.

(10) Patent No.: US 6,421,250 B1
(45) Date of Patent: Jul. 16, 2002

(54) MULTI IN-LINE MEMORY MODULE AND MATCHING ELECTRONIC COMPONENT SOCKET

(75) Inventors: Jong-ryeul Kim, Kyungki-do; Jung-joon Lee, Seoul; Bok-moon Kang, Kyungki-do, all of (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/405,514

(22) Filed: Sep. 23, 1999

(30) Foreign Application Priority Data

Jan. 7, 1999 (KR) ................................. 99-171

(51) Int. Cl.⁷ .............................. H05K 1/11; H05K 1/14
(52) U.S. Cl. ...................... 361/784; 361/760; 361/720; 361/785; 361/684; 439/59; 439/62; 439/65; 174/254; 174/255
(58) Field of Search ................................ 361/784, 785, 361/803, 750, 760, 720, 733, 748, 749, 684; 174/254, 255; 439/377, 59, 62, 65

(56) References Cited

U.S. PATENT DOCUMENTS

| | | | | |
|---|---|---|---|---|
| 3,492,538 A | * | 1/1970 | Fergusson | 317/101 |
| 4,331,370 A | * | 5/1982 | Andrews et al. | 339/17 |
| 4,647,123 A | * | 3/1987 | Chin et al. | 439/59 |
| 5,112,238 A | * | 5/1992 | Cizin | 439/188 |
| 5,270,964 A | * | 12/1993 | Bechtolsheim et al. | 365/52 |
| 5,345,364 A | * | 9/1994 | Biernath | 361/749 |
| 5,383,148 A | | 1/1995 | Testa et al. | 365/52 |
| 5,402,078 A | * | 3/1995 | Hamilton | 324/760 |
| 5,648,892 A | * | 7/1997 | Wieloch et al. | 361/788 |
| 5,692,910 A | * | 12/1997 | Mittal | 439/59 |
| 6,048,213 A | * | 4/2000 | Lai et al. | 439/74 |

FOREIGN PATENT DOCUMENTS

| | | | | |
|---|---|---|---|---|
| KR | 1991-0022696 | | 12/1991 | H01L/21/56 |
| KR | 1992-016695 | | 9/1992 | H01L/23/02 |

* cited by examiner

*Primary Examiner*—David Martin
*Assistant Examiner*—Hung Bui
(74) *Attorney, Agent, or Firm*—Skjerven Morrill LLP; David W Heid

(57) ABSTRACT

A multi in-line module and an electronic component socket for the multi in-line module are provided. One embodiment of a multi in-line memory module includes a printed circuit board having at least two protrusions formed along one edge of the printed circuit board. Each of the protrusions has first and second surfaces for blocks of contact pins. Accordingly, the module can include three or more pin blocks on separate surfaces of the protrusions. The module provides a large number of pins without being significantly larger than a conventional SIMM or DIMM. Alternatively, physical and electrical attachment of multiple circuit boards provides three or more independent pin blocks on the various surfaces of the printed circuit boards. A socket for a module includes dielectric protrusions with two or more gaps between the protrusions and contact pins on side surfaces of the protrusions that are in the gaps. Inserting the protrusions of a multi in-line module into the gaps between the protrusions of the socket creates an electrical connection between contact pins on the module and contact pins of the socket.

10 Claims, 4 Drawing Sheets

MULTI IN-LINE MEMORY MODULE AND MATCHING ELECTRONIC COMPONENT SOCKET

BACKGROUND OF THE INVENTION

1. Field of the Invention

The present invention relates to the physical connections and architecture of electronic circuits and more particularly, to in-line memory modules and matching sockets for use in computer systems.

2. Description of the Related Art

Memory modules, such as single in-line memory modules and dual in-line memory modules typically contain multiple semiconductor memory devices. A single in-line memory module employs a single line of metal pins or contacts on one side of the module, and a dual in-line memory module employs two lines of metal pins or contacts on opposite sides of the module. Thus, a dual in-line memory module can accommodate a greater number of metal pins for electrical connection to an external system than a single in-line memory module of the same size. As the functions and structures of computer systems become more complicated and therefore require more contacts and I/O signals, dual in-line memory modules are being used more frequently than single in-line memory modules.

FIG. 1 shows a conventional dual in-line memory module 101, which includes a printed circuit board 111 on which a plurality of semiconductor memory devices (not shown) are mounted, Two pin blocks 121 and 122 are on printed circuit board 111 for electrically connecting the semiconductor memory devices to an external system. Each of pin blocks 121 and 122 includes a plurality of contact pins 131. In the conventional dual in-line memory module 101, the pitch between contact pins 131 must be reduced, or the printed circuit board 111 must be enlarged, to increase the number of pins 131. However, there is a limit to the reduction of the pitch of pins 131. Thus, to increase the number of pins 131, the size of the printed circuit board 111 must be increased.

FIG. 2 shows a conventional electronic component socket 211 mounted on a circuit board 221. Socket 211 has two pin blocks 231 and 232 with each of pin blocks 231 and 232 a set of metal pins 241. Pins 241 in socket 211 couple to matching pins 131 on dual in-line memory module 101 of FIG. 1 when dual in-line memory module 101 is plugged into socket 211. The semiconductor devices on module 101 electrically connect through pins 131 and 241 to a plurality of semiconductor devices (not shown) on circuit board 221.

In the conventional dual in-line memory module 101 as described above, increasing the number of pins 131 to accommodate the functionality of semiconductor memory devices mounted on dual in-line memory module 101 requires increasing the size of dual in-line memory module 101. A larger dual in-line memory module 101 requires a larger socket 211. Further, any system using dual in-line memory module 101 and electronic component socket 211 must be larger, and the manufacturing cost of the system is increased.

SUMMARY OF THE INVENTION

In accordance with an aspect of the present invention a multi in-line memory module has three or more lines of pins to increase the number of pins on a memory module without increasing the size of the memory module. Further, an accompanying socket for the multi in-line module can accommodate the larger number of pins without a corresponding increase in required system size. In accordance with an embodiment of the invention, a multi in-line module includes a printed circuit board having at least two protrusions formed along one edge. Each of the protrusions has two surfaces suitable for pin blocks, and one pin block is on each surface of the protrusions, although one of the surface can be unused if the module has sufficient pins without using the surface. For memory applications, semiconductor memory devices are mounted on at least one surface of the circuit board, and the pin blocks on the protrusions connect to the semiconductor memory devices via conductive paths inside the protrusions and/or the circuit. In an exemplary embodiment, each of the pin blocks includes a plurality of metal pins, and the surfaces of the protrusions are parallel to the surfaces of the circuit board.

In accordance with another embodiment of the invention, a multi in-line module includes: at least two printed circuit boards each having first and second surfaces. A fixing device connects the printed circuit boards as a single body. With one pin block formed on each surface of the printed circuit broad, the module provides more pins than does a conventional DIMM. Preferably, each of the pin blocks includes a plurality of metal pins, and the fixing device fixes the printed circuit boards parallel to each other. It is also preferable that semiconductor memory devices are mounted on at least one surface of at least one of the printed circuit boards.

In accordance with yet another embodiment of the invention, an electronic component socket includes at least three protrusions formed on a base and pin blocks formed on the side surfaces of the protrusions. Preferably, each of the pin blocks includes a plurality of metal pins. The base and the protrusions are typically dielectrics. The electronic component socket couples to a multi in-line memory module when a board or a protrusion of the module is in each of the gaps between the protrusions of the socket. The base of the socket is typically a printed circuit board on which devices that connect to the module are mounted.

According to an aspect of the present invention, the number of pins available to a memory module can be increased without a proportion increase in size of the memory module.

BRIEF DESCRIPTION OF THE DRAWINGS

The above features and advantage of the present invention will become more apparent by describing embodiments thereof with reference to the attached drawings in which.

Use of the same reference symbols in different figures indicates similar or identical items.

DESCRIPTION OF THE PREFERRED EMBODIMENTS

Hereinafter, embodiments of the present invention are described in detail with reference to the attached drawings.

Figure 3:
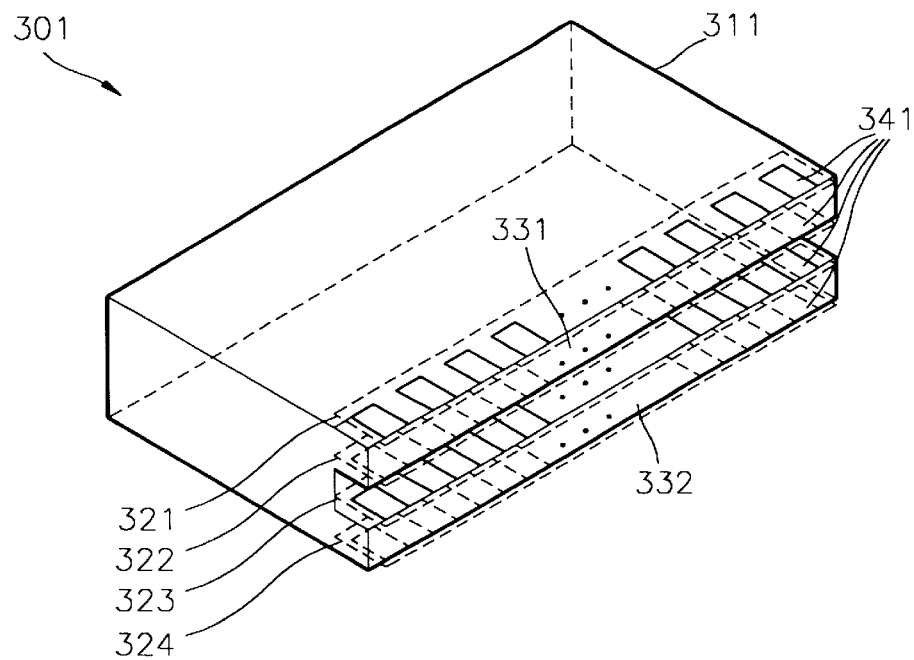
FIG. 3 is a perspective view of a multi in-line memory module (MIMM) according to a first embodiment of the present invention.

FIG. 3 shows a multi in-line memory module 301 according to an embodiment of the present invention. Memory module 301 has four pin blocks 321 through 324 on protrusions 331 and 332 from a printed circuit board 311. Printed circuit board 311 has a first surface, e.g., the upper surface in FIG. 3, and a second surface, e.g., the lower surface in FIG. 3. Protrusions 331 and 332 are rectangular, made of a dielectric material, and extend from one edge of printed circuit board 311. Each protrusion 331 or 332 has two surfaces parallel to the upper and lower surfaces of circuit board 311. Pin block 321 is on the upper surface of protrusion 331, and pin block 322 is on the lower surface of protrusion 331. Pin block 323 is on the upper surface of protrusion 332, and pin block 324 is on the lower surface of protrusion 332. Each of pin blocks 321 through 324 includes a plurality of conductive contacts or metal pins 341.

Figure 4A:
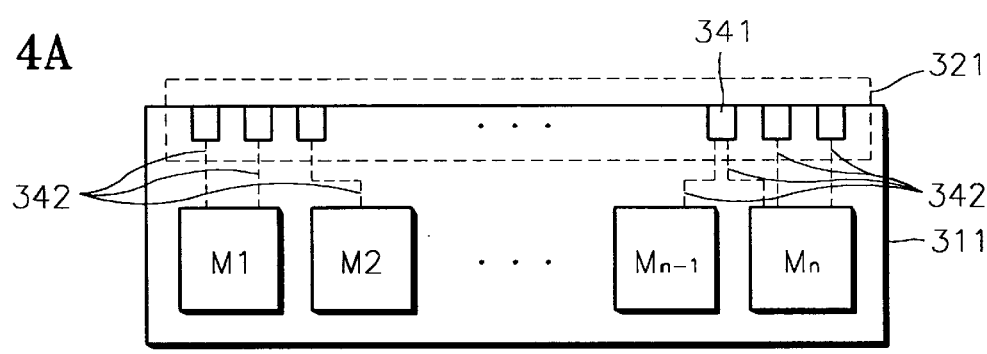
FIGS. 4A and 4B are block diagrams respectively illustrating first and second surfaces of the MIMM shown in FIG. 3.

FIG. 4A shows a plurality of semiconductor memory devices M1 through Mn mounted on the first surface of printed circuit board 311. Semiconductor memory devices M1 through Mn electrically connect to pin block 321 formed on the first surface, for example, via electrically conductive traces 342 on the first surface or in the interior of circuit board 311 and protrusion 331. Metal pins 341 in pin block 322 electrically connect to semiconductor memory devices M1 through Mn via, for example, electrically conductive traces 342 inside protrusion 331 or circuit board 311.

Figure 4B:
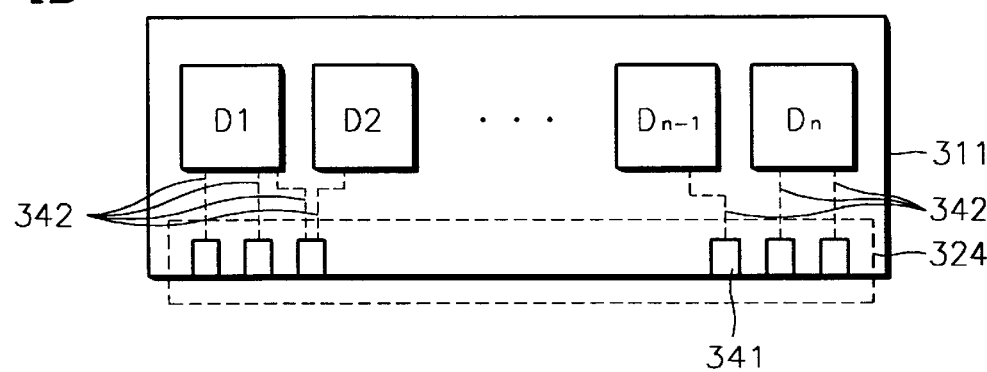

FIG. 4B shows semiconductor memory devices D1 through Dn mounted on the second surface of circuit board 311. Semiconductor memory devices D1 through Dn electrically connect to pin block 324 formed on the second surface. Metal pins 341 in pin block 323 electrically connect to the plurality of semiconductor memory devices D1 through Dn via, for example, electrically conductive traces 342 inside protrusion 332 or circuit board 311.

Processes for forming conductive patterns inside printed circuit boards are well known in the art and can be used to connect devices D1 through Dn and devices M1 through Mn to respective metal pins 341. For example, circuit board 311 can include three insulating layers, a middle layer and top and bottom layers that extend further than the middle layer, to provide protrusions 321 and 322. Patterned metal layers can be provided in or on the three insulating layers for conventional pressing that forms circuit board 311.

Some or all of semiconductor memory devices M1 through Mn and D1 through Dn respectively mounted on the first and second surfaces can be replaced by semiconductor devices having control functions.

As described above, the two protrusions 331 and 332 are part of printed circuit board 311, and the four pin blocks 321 through 324 are on respective upper and lower surfaces of protrusions 331 and 332. Thus, memory module 301 has about twice as many metal pins 341 as a DIMM of about the same size would have. The increase in the number of metal pins 341 increases the utility of multi in-line memory module 301 particularly in compact computer systems.

Memory module 301 as illustrated in FIG. 3 has two protrusions and four pin blocks 321 though 324, but the principles of module architecture illustrated in FIG. 3 can expand to include 3 or more protrusions to further expand the number of available pins and further improve the functionality of the memory module. Pin blocks can be on one or both sides of each protrusion depending on the number of pins 341 required for the devices on the module.

Figure 1:
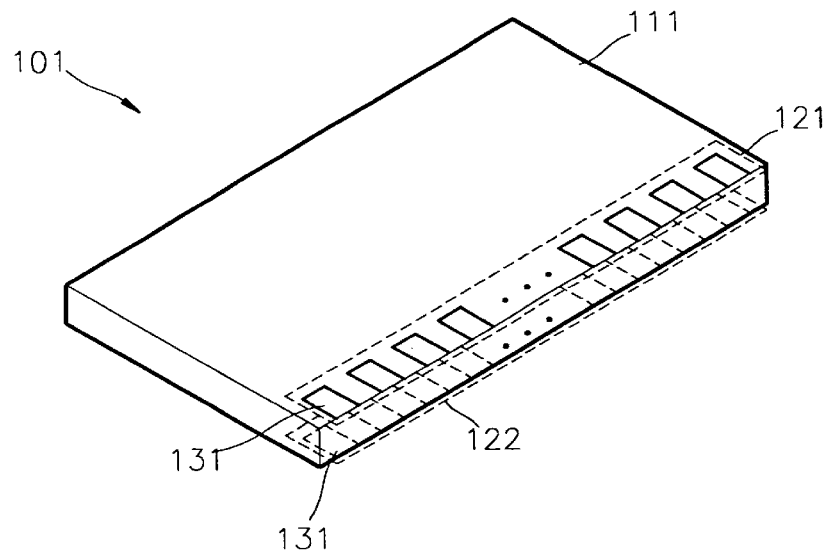
FIG. 1 is a perspective view of a conventional dual in-line memory module (DIMM)
Figure 2:
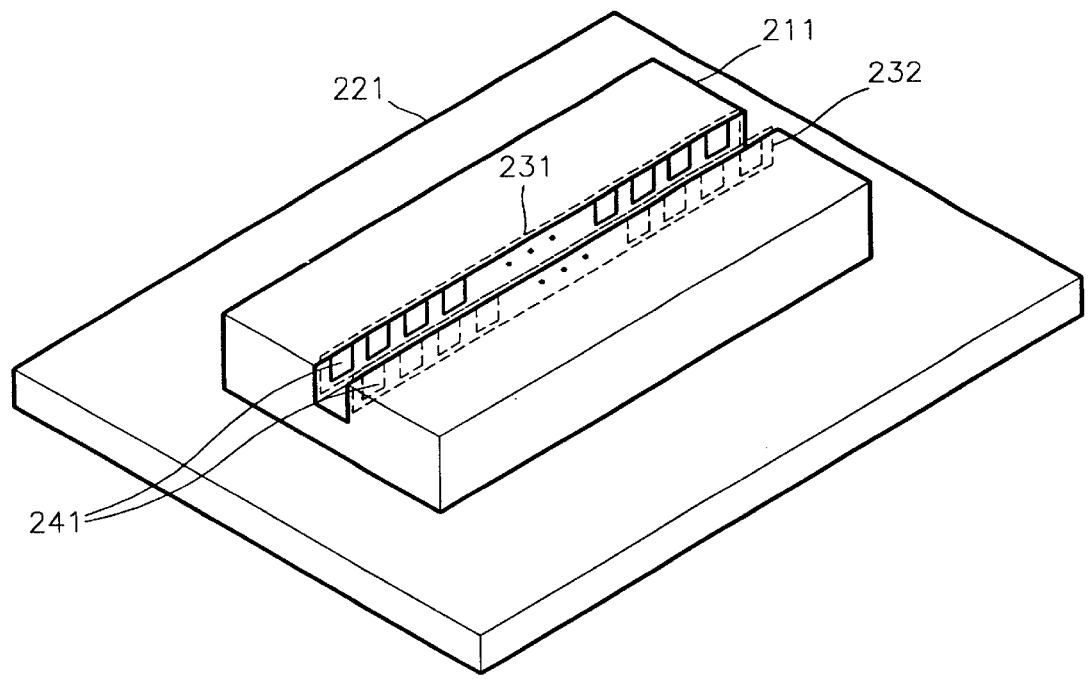
FIG. 2 is a perspective view of a conventional electronic component socket on a circuit board.
Figure 5:
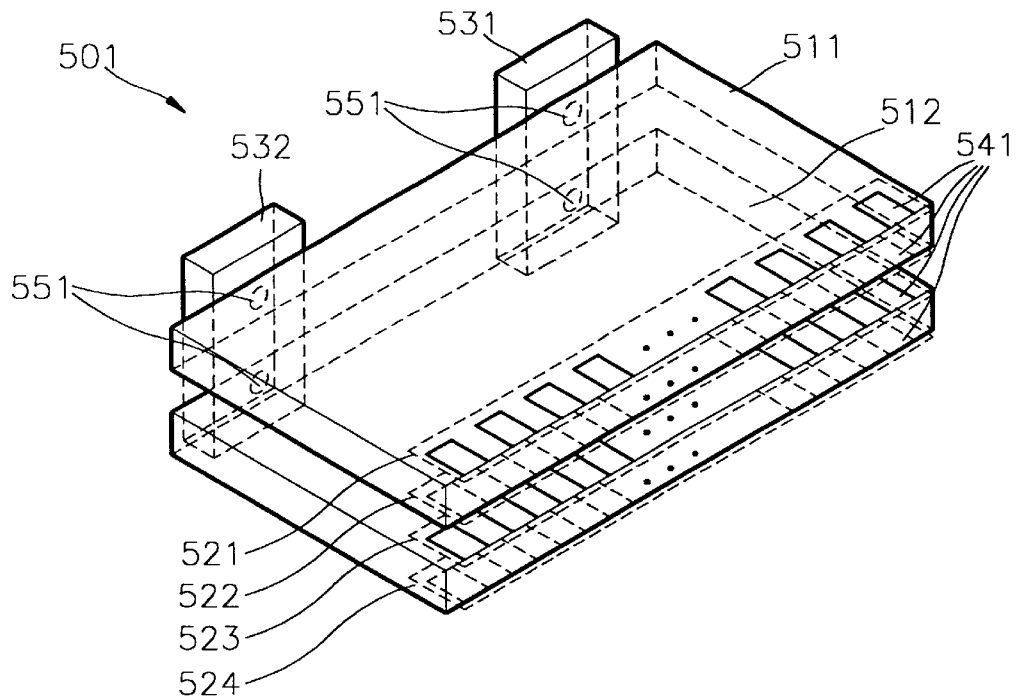
FIG. 5 is a perspective view of a MIMM according to a second embodiment of the present invention.

FIG. 5 shows another embodiment of a multi in-line memory module 501 according to the present invention. Memory module 501 includes two printed circuit boards 511 and 512. Fixing devices 531 and 532 physically connect circuit boards 511 and 512 to create one body. Fixing devices 531 and 532 can also provide electrical connections between circuit boards 511 and 512. Although FIG. 5 shows two fixing devices 531 and 532, more generally, at least one fixing device is required. Fixing devices 531 and 532 hold printed circuit boards 511 and 512 in parallel alignment and have fixing means 551 such as screws that attach fixing devices 531 and 532 to circuit boards 511 and 512. Clearly, fixing devices 531 and 532 are not limited to the shapes shown in FIG. 5 and can have various transformed shapes. Multi in-line memory module 501 of FIG. 5 effectively combines two dual in-line memory modules 101 of FIG. 1 into a single body using two fixing devices 531 and 532. Thus, the memory module 501 includes four pin blocks 521 through 524 and provides twice as many pins as a DIMM. Each of pin blocks 521 through 524 includes a plurality of conductive metal pins 541. Since memory module 501 includes four pin blocks 521 through 524, memory module can provide the same electrical connections as memory block 301 of FIG. 3. Memory module 501 can alternatively include three or more circuit boards combined into a single body using fixing devices 531 and 532.

Figure 6:
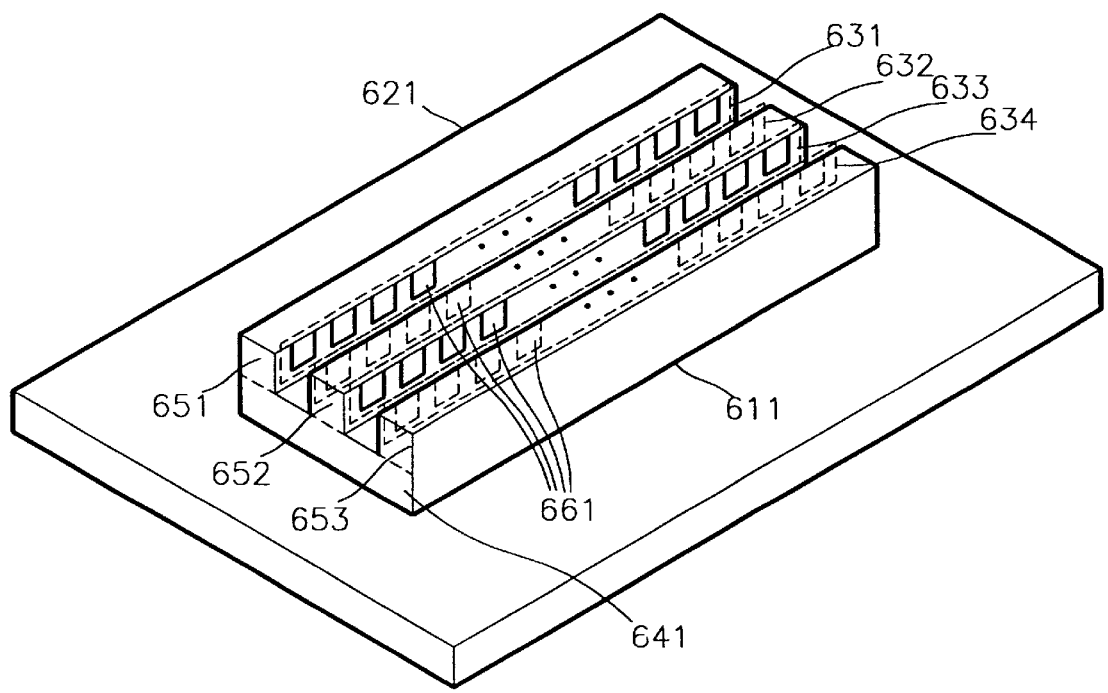
FIG. 6 is a perspective view showing an electronic component socket according to an embodiment of the present invention.

FIG. 6 shows an electronic component socket 611 according to an embodiment of the present invention that is mounted on a circuit board 621. Socket 611 includes a base 641 having three protrusions 651 through 653 and pin blocks 631 through 634. Base 641 is flat and formed of a dielectric material such as plastic. Protrusions 651 through 653 are on base 641, and pin blocks 631 through 634 are on the side surfaces of protrusions 651 through 653. More specifically, pin block 631 is on the side of protrusion 651 closest to protrusion 652. Pin blocks 632 and 633 are on opposite sides of the protrusion 652, and pin block 634 is the side of protrusion 653 closest to protrusion 652. Each of pin blocks 631 through 634 includes a plurality of conductive metal pins 661. The plurality of conductive metal pins 661 electrically connect via the interior or surface wiring through base 641 to a circuit typically including semiconductor or other electric devices mounted on circuit board 621.

In FIG. 6, electronic component socket 611 includes three protrusions 651 through 653 with two gaps between the protrusions. The gaps match the spacing of protrusions 331 and 332 on module 301 (FIG. 3) or the spacing of circuit boards 511 and 512 of module 501. However, when a module has three or more protrusions or connected circuit boards for a greater number of metal pins, the matching socket can include four or more protrusions and associated metal pins matching the metal pins on a module.

Figure 7:
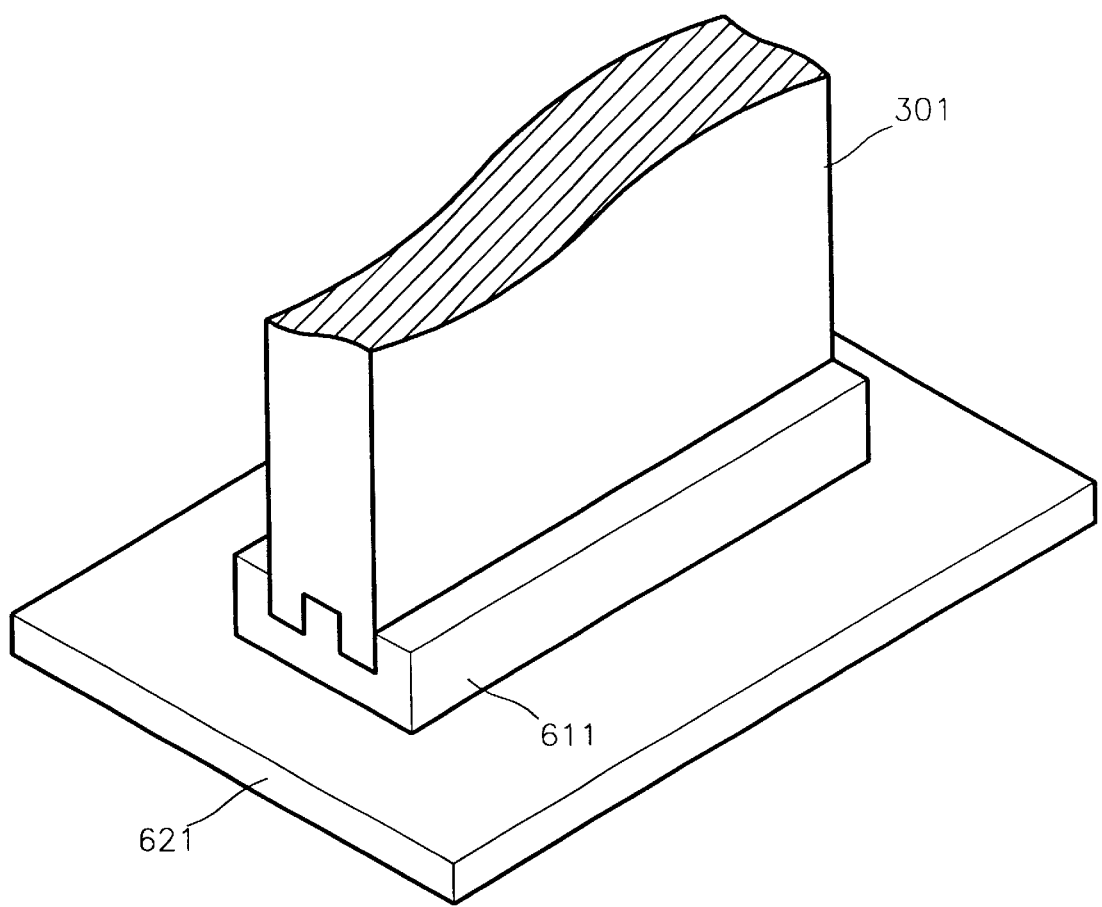
FIG. 7 is a perspective view of the MIMM of FIG. 3 coupled to the electronic component socket of FIG. 6.

FIG. 7 shows multi in-line memory module 301 of FIG. 3 inserted in electronic component socket 611 of FIG. 6. As described above, electronic component socket 611 is suitable for either multi in-line memory module 301 or 501 of FIGS. 3 or 5. Thus, electronic component socket 611 has a shape according to multi in-line memory module 301 or 501. More specifically, when the multi in-line memory module has two protrusions, electronic component socket 611 has three protrusions defining two gaps matching the protrusions. When the multi in-line memory module has three protrusions, the electronic component socket 611 has four protrusions defining three gaps matching the protrusions.

Electronic component socket 611 configured as described in FIG. 6, reduces the size of a system which uses multi in-line memory module 301 or 501 and the electronic component socket 611. In particular, the system can have more control functions access to memory module 301 or 501, without a corresponding increase in size. Accordingly, use of a multi in-line module and socket improves the performance of the system by achieving miniaturization and a reduction of costs. Since the described module and socket architectures increase the number of metal pins without significantly enlarging memory module 301 or 501, memory module 301 or 501 can accommodate a semiconductor memory devices having more complicated control signals. Also, since module 301 or 501 can accommodate semiconductor memory devices having a large number of output pins, memory module 301 or 501 can provide a high data bandwidth in spite of its small size.

Although the invention has been described with reference to particular embodiments, the description is only an example of the invention's applications and should not be taken as a limitation. Here, special terms used in the description are used only to explain the present invention, not to restrict meanings or limit the scope of the present invention as set forth in the following claims. Further, even though much of preceding discussion was aimed at memory modules such as commonly employed in computer systems, alternative embodiments of this invention include modules suitable for mounting of other device, not limited to semiconductor memory devices. Various other adaptations and combinations of features of the embodiments disclosed are within the scope of the invention as defined by the following claims.

What is claimed is:

1. A multi in-line module comprising:

a printed circuit board;

at least two protrusions formed along one edge of the printed circuit board, each of the protrusions having first and second surfaces for contact pins; and at least three blocks of pins, each block being on a different one of the first and second surfaces of the protrusions.

2. The multi in-line module of claim 1, wherein a plurality of semiconductor memory devices are mounted on at least one surface of the printed circuit board.

3. The multi in-line module of claim 2, further comprising conductors inside the printed circuit board, wherein one or more of the blocks connect to the semiconductor memory devices via the conductors inside the printed circuit board.

4. The multi in-line module of claim 1, wherein each of the blocks of pins includes a plurality of metal pins.

5. The multi in-line module of claim 1, wherein the first and second surfaces of the protrusions are parallel to surfaces of the printed circuit board.

6. The multi in-line module of claim 1, wherein the protrusions comprise a dielectric material.

7. A multi in-line module comprising:

at least two printed circuit boards each having first and second surfaces;

a fixing device that connects the printed circuit boards as a single body; and one pin block on each of the first and second surfaces of the printed circuit boards, wherein each of the pin blocks is positioned to provide electrical connections to the multi in-line module.

8. The multi in-line module of claim 7, wherein each of the pin blocks includes a plurality of metal pins.

9. The multi in-line module of claim 7, wherein the fixing device fixes the printed circuit boards parallel to each other.

10. The multi in-line module of claim 7, wherein a plurality of semiconductor memory devices are mounted on at least one surface among the first and second surfaces of the printed circuit boards.

* * * * *